(12) United States Patent
Percin et al.

(10) Patent No.: US 7,392,502 B2
(45) Date of Patent: *Jun. 24, 2008

(54) METHOD FOR REAL TIME MONITORING AND VERIFYING OPTICAL PROXIMITY CORRECTION MODEL AND METHOD

(75) Inventors: Gökhan Percin, Los Gatos, CA (US); Ram Ramanujam, Santa Cruz, CA (US); Franz Xaver Zach, Los Gatos, CA (US); Koichi Suzuki, Tokyo (JP)

(73) Assignee: Invarium, Inc., San Jose, CA (US)

( * ) Notice: Subject to any disclaimer, the term of this patent is extended or adjusted under 35 U.S.C. 154(b) by 71 days.

This patent is subject to a terminal disclaimer.

(21) Appl. No.: 11/169,616

(22) Filed: Jun. 30, 2005

(65) Prior Publication Data

US 2007/0006116 A1 Jan. 4, 2007

(51) Int. Cl.
*G06F 17/50* (2006.01)

(52) U.S. Cl. .............................. 716/19; 716/20; 716/21; 430/5; 430/30

(58) Field of Classification Search ............. 716/19–21; 703/2; 430/5, 30
See application file for complete search history.

(56) References Cited

U.S. PATENT DOCUMENTS

| 6,602,642 | B2 * | 8/2003 | Liu et al. ........................ 430/5 |
| 6,673,638 | B1 * | 1/2004 | Bendik et al. ................. 438/14 |
| 6,701,512 | B2 * | 3/2004 | Sutani et al. .................. 716/21 |
| 6,824,931 | B2 * | 11/2004 | Liu et al. ........................ 430/5 |
| 6,883,158 | B1 * | 4/2005 | Sandstrom et al. ............ 716/19 |
| 7,065,738 | B1 * | 6/2006 | Kim ............................. 716/19 |
| 7,266,800 | B2 * | 9/2007 | Sezginer ...................... 716/21 |
| 2003/0215155 | A1 * | 11/2003 | Serrano et al. .............. 382/254 |
| 2006/0282814 | A1 * | 12/2006 | Percin et al. .................. 716/21 |

OTHER PUBLICATIONS

Schellenberg et al., A new process monitor for reticles and wafer: The MEEF meter, 2000, SPIE, vol. 3998, pp. 187-194.*
Buades et al., On image denoising methods, 2004, CMLA, pp. 1-40.*

* cited by examiner

*Primary Examiner*—Jack Chiang
*Assistant Examiner*—Nghia M Doan
(74) *Attorney, Agent, or Firm*—Sheppard Mullin; Richter & Hampton LLP (57) ABSTRACT

This invention relates to a method for real time monitoring and verifying optical proximity correction (OPC) models and methods in production. Prior to OPC is performed on the integrated circuit layout, a model describing the optical, physical and chemical processes involving lithography should be obtained accurately and precisely. In general, the model is calibrated using the measurements obtained by running wafers through the same lithography, patterning, and etch processes. In this invention, a novel real time method for verifying and monitoring the calibrated model on a production or monitor wafer is presented: optical proximity corrected (OPC-ed) test and verification structures are placed on scribe lines or cut lines of the production or monitor wafer, and with pre-determined schedule, the critical dimensions and images of these test and verification structures are monitored across wafer and across exposure field.

20 Claims, 7 Drawing Sheets

METHOD FOR REAL TIME MONITORING AND VERIFYING OPTICAL PROXIMITY CORRECTION MODEL AND METHOD

RELATED APPLICATIONS

This application is related to U.S. patent application Ser. No. 11/141,803 entitled, "METHOD FOR MEASURING AND VERIFYING STEPPER ILLUMINATION", filed May 31, 2005, which related application is incorporated herein by reference as though fully set forth. The present application is also related to U.S. patent application Ser. No. 11/139,551 entitled "CALIBRATION ON WAFER SWEET SPOTS" filed on May 31, 2005. The present application is further related to U.S. patent application Ser. No. 11/141,805 entitled, "METHOD FOR VERIFYING AND CHOOSING LITHOGRAPHY MODEL", filed on May 31, 2005 which related applications are incorporated herein by reference as though fully set forth.

TECHNICAL FIELD

This invention relates to the general field of lithography. In particular, it relates to verification and monitoring of optical proximity correction model and method for lithography.

BACKGROUND

One of the Optical Proximity Correction (OPC) process is a model-based optical proximity correction method, which adjusts photomask data so that the pattern resulting on the wafer is a close replica of a target pattern. An essential element of model-based OPC is a computational model of the patterning process. The computational model describes all or some aspects of: optical projection, reactions and diffusion of chemicals in the photoresist, and etching of the wafer. The computational model usually has parameters that need to be determined empirically. These parameters are determined by printing test patterns on wafers using the lithography equipment and processes (such as lithography and etch) that need to be modeled. Critical dimensions of the patterns (such as photoresist and etched wafer) resulting on the test wafer are measured. Some parameters of the model are adjusted until the difference between the predictions of the model and the patterns printed on the wafer are minimized. This process is called "calibration" of the model. Next critical step for obtaining computational models is the verification and the monitoring of these models in production. Without the model verification and monitoring, OPC may not be accurate.

The prior art described in the following U.S. Patents describe several devices and patterns placed in cut-lines (or equivalently scribe lines) to monitor and measure device characteristics and performance in production. However, the prior art does not include placing optical proximity corrected (OPC-ed) test and verification structures. Typical structures and devices mentioned in the prior art are functional small circuits to test and monitor electrical performance and programmed defects to test defect printability.

1. Stine, et al., "System and method for product yield prediction using a logic characterization vehicle," U.S. Pat. No. 6,834,375, Dec. 21, 2004.
2. Stine, et al., "System and method for product yield prediction using device and process neighborhood characterization vehicle," U.S. Pat. No. 6,795,952, Sep. 21, 2004.
3. Iwasa, et al., "Semiconductor integrated circuit," U.S. Pat. No. 5,703,381, Dec. 30, 1997.
4. Sugasawara, "Process monitor circuitry for integrated circuits," U.S. Pat. No. 6,124,143, Sep. 26, 2000.
5. Kim, et al., "Method for manufacturing a semiconductor device and semiconductor device with overlay mark," U.S. Pat. No. 6,803,292, Oct. 12, 2004.
6. Cai, et al., "System and method of providing mask defect printability analysis," U.S. Pat. No. 6,873,720, Mar. 29, 2005.

The prior art described in the following U.S. Patents do not take model verification and monitoring into account. The model describing lithography process and exposure tool in the prior art is based on SEM measurements and images of photoresist patterns, and usually for one dose and defocus condition.

1. Ivanovic, et al., "Automatic calibration of a masking process simulator," U.S. Pat. No. 6,768,958, Jul. 27, 2004.
2. Ivanovic, et al., "Automatic calibration of a masking process simulator," U.S. patent application Ser. No. 10/829,408, Apr. 20, 2004.
3. Garza, et al., "Comparing aerial image to SEM of photoresist or substrate pattern for masking process characterization," U.S. Pat. No. 6,078,738, Jun. 20, 2000.
4. Laidig, et al., "Method of two dimensional feature model calibration and optimization," U.S. patent application Ser. No. 10/266,922, filed Oct. 9, 2002.
5. Garza, et al., "Comparing aerial image to actual photoresist pattern for masking process characterization," U.S. Pat. No. 6,081,659, Jun. 27, 2000.

As indicated above, computational models utilized in optical proximity correction processes must be accurate and precise. However, there exists no process which provides an accurate computational method which is also verified. Accordingly, there is a need for a new and improved computational model verification process that improves the accuracy and precision of such computational models.

BRIEF SUMMARY OF THE INVENTION

This invention relates to a method for verifying and monitoring models used with optical proximity correction (OPC) in production. Prior to OPC is performed on the integrated circuit layout, a model describing the optical, physical and chemical processes involving lithography should be obtained accurately and precisely. In general, the model is calibrated using the measurements obtained by running wafers through the same lithography, patterning, and etch processes. In this invention, a novel method for verifying and monitoring the calibrated model on a production or monitor wafer is presented: optical proximity corrected (OPC-ed) test and verification structures are placed on scribe lines or cut lines of the production or monitor wafer, and with predetermined schedule, the critical dimensions and images of these test and verification structures are monitored across wafer and across exposure field.

The following paragraphs are provided in order to describe the best mode of working the invention and nothing in this section should be taken as a limitation of the claims.

BRIEF DESCRIPTION OF THE DRAWINGS

In order that the invention may be readily understood and put into practical effect, reference will now be made to exemplary embodiments as illustrated with reference to the accompanying drawings, where like reference numerals refer to identical or functionally similar elements throughout the separate views. The figures together with a detailed description below, are incorporated in and form part of the specification, and serve to further illustrate the embodiments and explain various principles and advantages, in accordance with the present invention where:

FIG. 7 illustrates edge detection of SEM image of the pattern. (a) Original image. (b) De-noised image. (c) Edge detection. (d) Edge contour.

DETAILED DESCRIPTION OF THE INVENTION

Before describing in detail embodiments that are in accordance with the present invention, it should be observed that the embodiments reside primarily in combinations of method steps related to computational model verification and monitoring process that verifies and monitors optical proximity correction models of lithography applied during the process of fabricating a semiconductor chip. Accordingly, the method steps have been represented where appropriate by conventional symbols in the drawings, showing only those specific details that are pertinent to understanding the embodiments of the present invention so as not to obscure the disclosure with details that will be readily apparent to those of ordinary skill in the art having benefit of the description herein. The terms "comprises", "comprising", or any other variations thereof, are intended to cover a non-exclusive inclusion, such that a process, method that comprises a list of steps does not include only those steps but may include other steps not expressly listed or inherent to such process, method. An element proceeded by "comprises . . . a" does not, without more constraints, preclude the existence of additional identical steps in the process or method that comprises the steps.

The following description is presented to enable any person skilled in the art to make and use the invention. For purposes of explanation, specific nomenclature is set forth to provide a thorough understanding of the present invention. Descriptions of specific applications, methods, and apparatus are provided only as examples. Various modifications to the preferred embodiments will be readily apparent to those skilled in the art, and the general principles defined herein may be applied to other embodiments and applications without departing from the spirit and scope of the invention. Thus, the present invention is not intended to be limited to the embodiments shown, but is to be accorded the widest scope consistent with the principles and features disclosed herein.

Before describing the preferred embodiments of the present invention in greater detail, it may be beneficial to briefly consider the model based optical proximity correction process. Model-based optical proximity correction (OPC) adjusts photomask data so that the pattern resulting on a wafer is a close replica of a target pattern. An essential element of model-based OPC is a computational model of the patterning process. The computational model describes all or some aspects of optical projection, reactions and diffusion of chemicals in the photoresist, and etching of the wafer. The computational model usually has parameters that need to be determined empirically.

More specifically, the above-mentioned parameters are determined by printing test patterns on wafers using the lithography equipment and processes (such as lithography and etch) that need to be modeled. Critical dimensions of, for example, photoresist and etched wafer patterns, resulting on a test wafer are measured to determine their accuracy. In some situations, various ones of the parameters of the computational model are adjusted until the difference between the predictions of the model and the patterns printed on the wafer are minimized. This process is called "calibration" of the model.

Next, and critically important in model-based OPC, is to verify or determine whether the obtained computational model performs as expected. In this regard, without computational model verification, OPC may not be accurate. Notwithstanding the importance of this aspect of model-based OPC, the prior art described in the above mentioned U.S. Patents fail to take model verification into account. The model describing lithography process and exposure tool in the prior art is based on SEM measurements and images of photoresist patterns, and usually for one dose and defocus condition.

Figure 1:
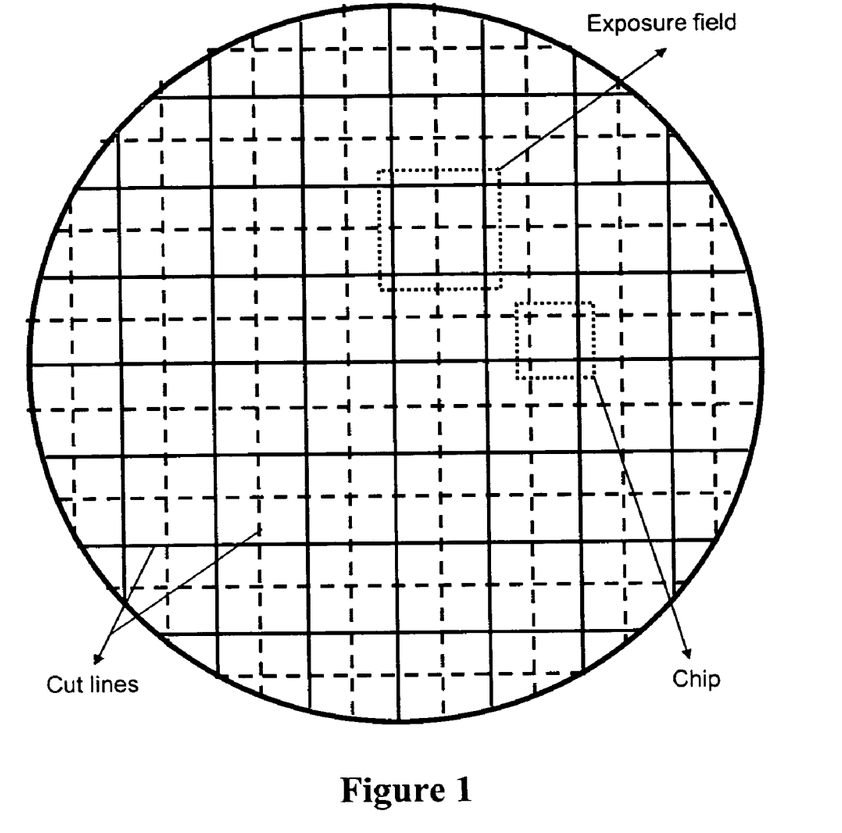
FIG. 1 illustrates the cut lines (or equivalently scribe lines).
Figure 2:
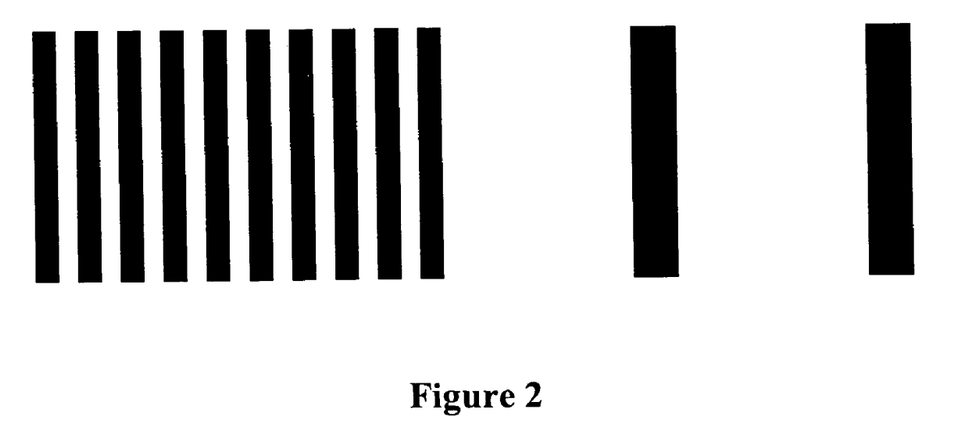
FIG. 2 illustrates verification or monitoring pattern that contains lines and spaces.
Figure 3:
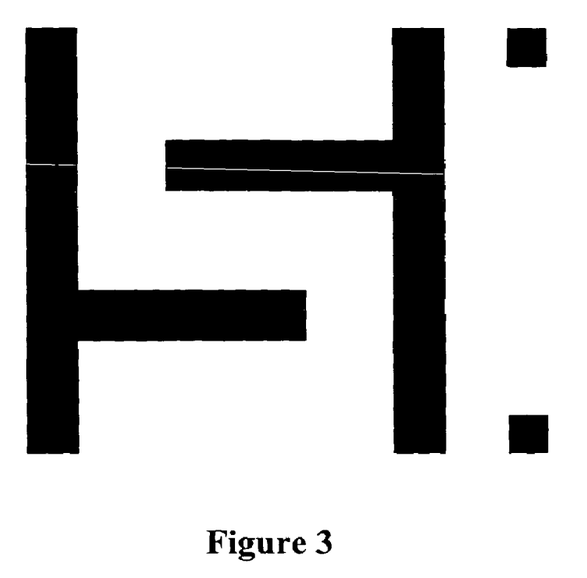
FIG. 3 illustrates verification or monitoring pattern that contains a part of the product.

The prior art of calibrating OPC models does not use verification and monitoring steps on separate structures besides the ones used for calibrating the models. In this invention, the models are calibrated using critical dimension SEM (CD-SEM) measurements which are taken for a set of printed predetermined structures with multiple defocus and dose conditions, i.e. using focus exposure matrix (FEM). These printed patterns/structures can be photoresist patterns and etch wafer patterns. Here, we present a novel method to monitor and verify models for OPC in production by placing a set of test and verification structures at scribe or cut lines on the production wafer shown in FIG. 1. The aforementioned structures may consist of line and space structures or as well as a critical (or functional) part of the product as shown in FIGS. 2 and 3.

The OPC-ed structures placed on scribe lines will be printed and etched using same physical and chemical process as the product chip. Usually, a wafer contains more than one exposure field, and each exposure field may contain more than one chip as shown in FIG. 1. The OPC-ed structures are placed preferably at the cut lines surrounding exposure field and at the cut lines surrounding chips.

As a person skilled in the art would be aware, a variety of mechanisms contribute to the errors in the calibration of the OPC models. Some of the variations that contribute to the errors in the calibration of the OPC models are across-exposure field variations and across wafer variations in the measured data.

Across-exposure field variations refer to effects, whereby the distortions of a pattern, induced through one of the processing steps depend on the location of the pattern within the field. Sources of such variations are, for the most part, caused by field-dependent variations in the mask and optical modules. Across-field effects can be corrected, as quite a few of these effects are systematic in nature.

Contrary to the above, the across-wafer variations are not correctable using OPC modeling.

Thus, in the present invention, the inventors are presenting the specific application where the variations are extracted into across field variations and across wafer variations and the obtained across field variations and across wafer variations are used for monitoring the OPC model in production.

Although, the method of verifying and monitoring OPC model can be performed in numerous ways by a person skilled in the art without departing from the teachings of the present invention, the Inventors here below describe two embodiments of verifying and monitoring the OPC models:

1. CD-SEM measurements are collected for the printed OPC-ed structures at multiple sites and this data is processed according the methods described in the following paragraphs;
2. SEM images of the printed OPC-ed structures at multiple sites, or alternatively by atomic-force microscopy (AFM), scanning-tunneling microscopy (STM), or transmission electron microscopy (TEM). These images are processed according the methods described in the following paragraphs.

DETAILED DESCRIPTION OF THE PREFERRED EMBODIMENTS

In the following paragraphs, the Applicants would describe in detail the two embodiments which have been highlighted in the above paragraphs for implementing the teachings of the present invention.

Figure 4:
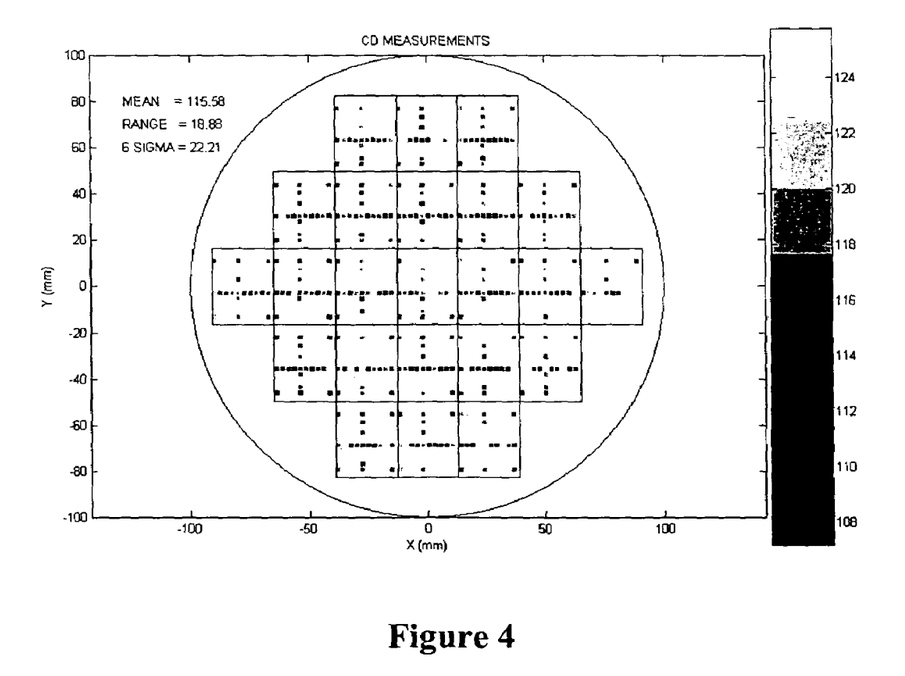
FIG. 4 illustrates CD measurements of monitoring structures located at scribe lines.
Figure 5:
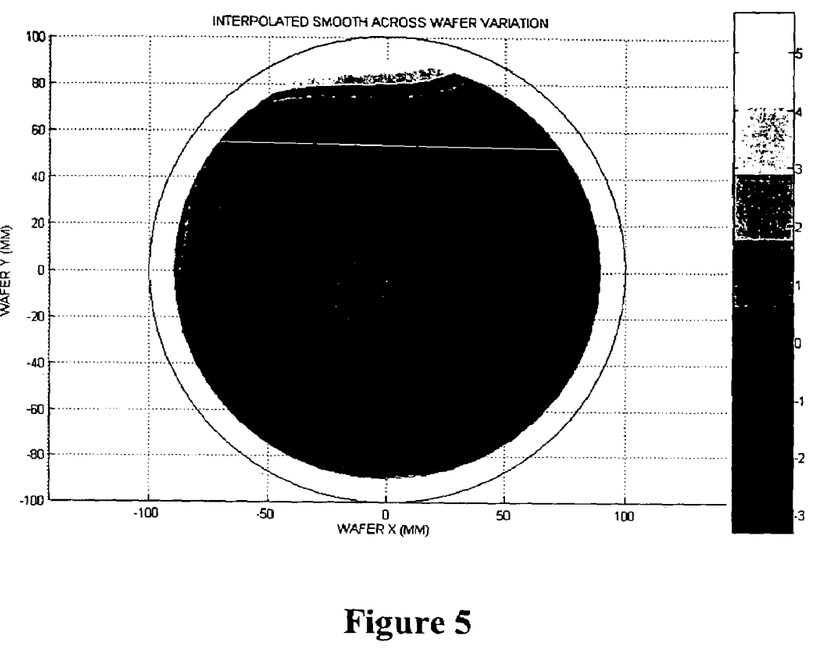
FIG. 5 illustrates smooth across wafer CD variation of monitoring structures.
Figure 6:
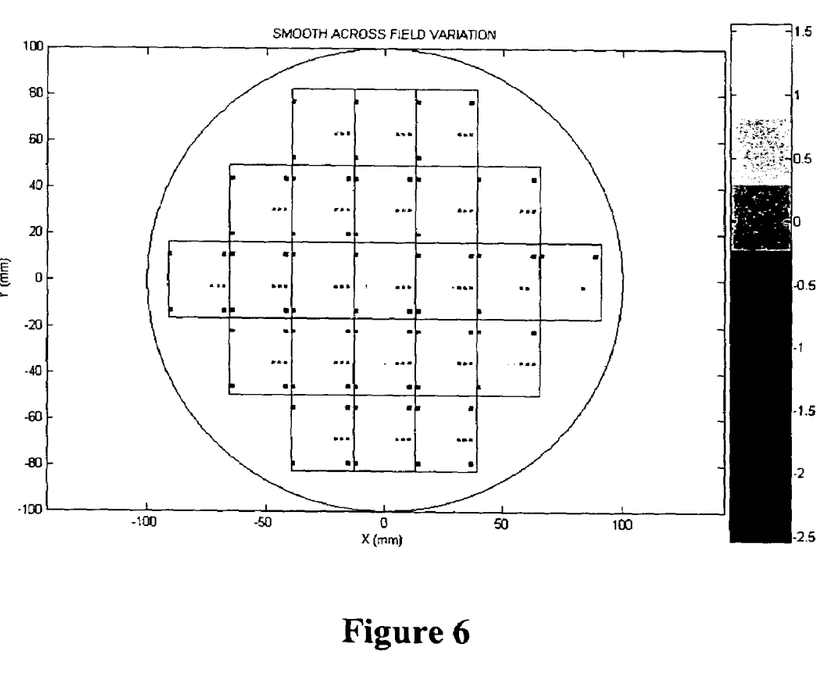
FIG. 6 illustrates smooth across exposure field CD variation of monitoring structures

In the first embodiment, CD-SEM measurements at multiple sites of the monitoring pattern and multiple sites of the wafer are used for obtaining across wafer and across field variations. In summary, this method comprises:

1. printing monitoring patterns on a product or monitor wafer, such as shown in FIGS. 2 and 3, at multiple sites at cut lines on a wafer as shown in FIG. 1;
2. obtaining CD-SEM measurements of the printed patterns at multiple sites, or alternatively by atomic-force microscopy (AFM), scanning-tunneling microscopy (STM), or transmission electron microscopy (TEM);
3. decomposing the CD-SEM measurements into across field and across wafer variations as shown in FIGS. 4, 5, and 6;
4. comparing CD measurements with the model predicted CD data, and checking whether deviation from the model CD is in acceptable range (specified by an user).

Preprocessing of the Measurements: Decomposition of Wafer, Field, Mask-Induced and Random Components of Variation The purpose of repeating structures and measurements over many points across the stepper field is to characterize variation of the patterning process across the stepper-scanner field. Across-wafer and wafer-to-wafer variations are best corrected by improving the control of these processes: spin-on and soft-bake of photoresist, exposure dose variation across the wafer, spatial uniformity of post-exposure bake and wafer etch. Across-wafer and wafer-to-wafer variations are not suitable for correction via the mask pattern since the same mask is used in a step-and-repeat fashion at each field. In order to determine across-field variations, across-wafer variations must also be determined. This is because across-wafer variations contribute to the variation across each field. Therefore, the two causes of variability need to be separated (see J. P. Cain, *Characterization of Spatial Variation in Photolithography*, M.S. thesis, University of California, Berkeley, 2002; Jason P. Cain, Costas J. Spanos, "Electrical linewidth metrology for systematic CD variation characterization and causal analysis," in *Metrology, Inspection, and Process Control for Microlithography XVII*, Proceedings of SPIE vol. 5038, 2003). For example, the decomposition is performed as follows:

$$measurement_{WAFER, DI}(s, x_f, y_f, x_w, y_w) = \quad (1)$$

$$CD_{0s} + \sum_{mn}\{A_{mn}(x_f, y_f) a_{mns}\} +$$

$$\sum_{mn}\{B_{mn}(x_w, y_w) b_{mns}\} + \sum_{mn}\{C_{mn}(x_w, y_w) c_{ms}\} +$$

$$MEEF_s \, measurement_{MASK}(s, x_f, y_f) +$$

$$Res_{DI}(s, x_f, y_f, x_w, y_w)$$

The first term on the right-hand side of (1), $CD_{0s}$, is the value of the measurement in the absence of across-field, across-wafer, and random variability.

The second term on the right-hand side of (1) represents smooth variation across the imaging field. This variation, for example, can be caused by position dependence of lens aberrations or flare. The basis functions $A_{mn}(x_f, y_f)$ are:

$$A_{mn}(x_f, y_f) = x_f^m y_f^n, \text{ or}$$

$$A_{mn}(x_f, y_f) = P_m(2x_f/F_x) P_n(2y_f/F_y)$$

where $P_m$ is the Legendre polynomial of degree m, and $F_x$ and $F_y$ are the dimensions of the field. Many other basis functions are possible. The advantage of Legendre polynomials is that they provide a complete, orthogonal basis with unity weighting over the stepper-scanner field (see Abramowitz, M. and Stegun, I. A. (Eds.), Ch. 22, *Handbook of Mathematical Functions with Formulas, Graphs, and Mathematical Tables*, 9th printing. New York: Dover, pp. 771-802, 1972).

The third term on the right-hand side of (1) represents a smooth variation across the wafer. This variation, for example, can be caused by radial variation of the resist thickness or post-exposure bake temperature. The basis functions $B_{mn}(x_w, y_w)$ are:

$$B_{mn}(x_w, y_w) = x_w^m y_w^n, \text{ or}$$

Zernike polynomial $Z_n(2x_w/D_w, 2y_w/D_w)$ where $D_w$ is the diameter of the wafer. Many other basis functions are possible. Zernike polynomials are particularly advantageous because they are complete and orthogonal on wafer with unity weighting (see Born, M. and Wolf, E., *Principles of Optics*, Ch. 9, 6th ed. New York: Pergamon Press, pp. 459-490, 1989).

The fourth term on the right-hand side of (1) indicates field-to-field exposure variations:

$$C_m(x_w, y_w) = 1 \text{ if } (x_w, y_w) \text{ is in field } m$$

$$= 0 \text{ otherwise.}$$

The fifth term on the right-hand side of (1) is the mask induced variability. $MEEF_s$, mask error enhancement factor, is a scalar constant specific to structure s.

The sixth term on the right-hand side of (1), $Res_{DI}(s, x_f, y_f, x_w, y_w)$ is the residual, i.e. random and systematic un-modeled variation. The coefficients $a_{mns}$, $b_{mns}$, $c_{ms}$, and $MEEF_s$ are determined by minimizing the 2-norm of the residual $Res_{DI}(s, x_f, y_f, x_w, y_w)$ in equation (1). The linear least-squares problem is solved by standard techniques of matrix calculations (see Golub, G. H. and Van Loan, C. F., *Matrix Computations*, Sect. 2.5.3 and 2.5.6, 3rd ed. Baltimore, Md.: Johns Hopkins University Press, 1996). The least squares problem is solved separately for each test structure index, s.

The purpose of repeating the measurements at many fields across the wafer is to quantify and fingerprint the smooth variation across the wafer so that the across-wafer and across-field variations are not confused. Identifying the across-wafer variation, however, does not require sampling every zone at every field.

Once the measurements are decomposed according to (1), across-wafer and random components (the residual) can be taken out of the measurements. This yields across-field variation of the lithography process:

$$\Delta CD_{AFLV,DI}(s, x_f, y_f) = \Sigma_{mn}\{A_{mn}(x_f, y_\eta)\alpha_{mns}\} \quad (2)$$

This would be the remaining the critical dimension variation if mask errors and across-wafer variations were eliminated. Similarly, the FI metrology (post wafer etch) can be decomposed as follows:

$$\begin{aligned}
measurement_{WAFER, FI}(s, x_f, y_f, x_w, y_w) = \\
measurement_{WAFER, DI}(s, x_f, y_f, x_w, y_w) + \\
\sum_{mn}\{A_{mn}(x_f, y_f)\alpha_{mns}\} + \\
\sum_{mn}\{B_{mn}(x_w, y_w)\beta_{mns}\} + Res_{FI}(s, x_f, y_f, x_w, y_w)
\end{aligned} \quad (3)$$

The second term on the right hand side of (3) represents variation of the etch bias across the imaging field. No such term is expected if all fields have the same layout and they are uniformly spaced across the wafer. The zones are equally spaced across the wafer if the alleys between the fields, and the alleys between dies (fields) within a field are of the same width. The third term on the right-hand side of (3) models across wafer variations in the etch process. The coefficients $\alpha_{mns}$ and $\beta_{mns}$ are determined by minimizing the 2-norm of the residual $Res_{FI}(s, x_f, y_f, x_w, y_w)$ in equation (3).

It should be noted that the across-wafer variation can be determined by any other process also including the process described in the other embodiments described in U.S. patent application Ser. No. 10/861,170.

Further description of how across wafer and field variations are obtained is presented in A. Sezginer, et al., "Method and System for Designing Manufacturable Patterns that Account for the Pattern- and Position-Dependent Nature of Patterning Processes" (U.S. patent application Ser. No. 10/861,170, Jun. 4, 2004). Here we are presenting the specific application where obtained across wafer and field variations are used for monitoring OPC model in production. Details of obtaining across wafer variations are described in the aforementioned patent application under the heading of "Preprocessing of the measurements: Decomposition of wafer, field, mask-induced and random components of variation."

The measurements shown in FIG. 4 were decomposed into the following components by solving a linear-least squares problem: a smooth variation across the wafer, a smooth variation that is replicated in each exposure field, a discontinuous remainder due to mask writing errors that is replicated in each exposure field, and a random, unmodeled remainder. FIG. 5 shows the smooth variation in line width across the exposed wafers. The smooth variation is represented by a linear combination of the first 16 Zernike polynomials (this is not to be confused with wavefront error of a lens which is also commonly expressed as a linear combination of Zernike polynomials). Zernike polynomials are convenient to use since they are orthogonal in the unit disk (see: M. Born and E. Wolf, *Principles of Optics*, Sect. 9.2.1, Cambridge University Press, 7th Ed., 1999).

FIG. 6 shows a smoothly varying component of line width variation across the exposure field. This fingerprint, which is replicated at each exposure field, is subject to correction by adjusting the mask data. A goal of the model calibration can be to capture and predict the finger print shown in FIG. 6.

Figure 7:
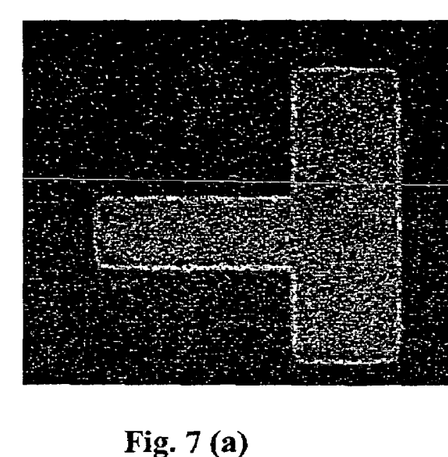
Figure 8:
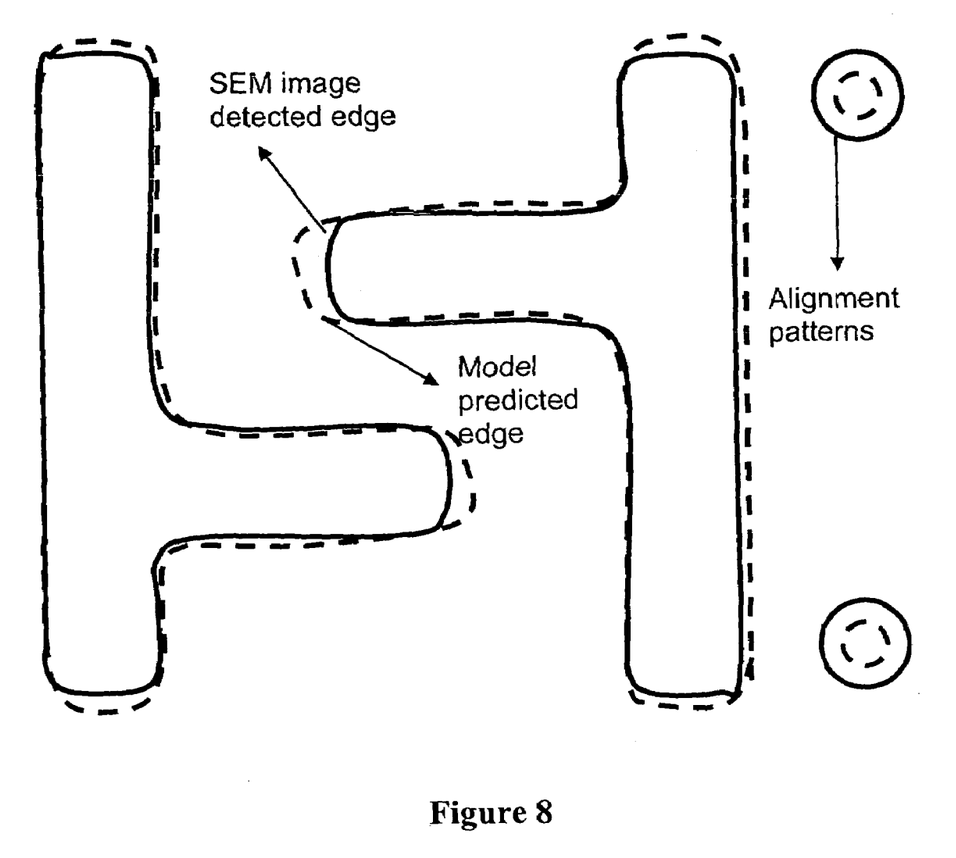
FIG. 8 illustrates the detected edge of the SEM image of the pattern and model predicted edge for the same pattern.
Figure 9:
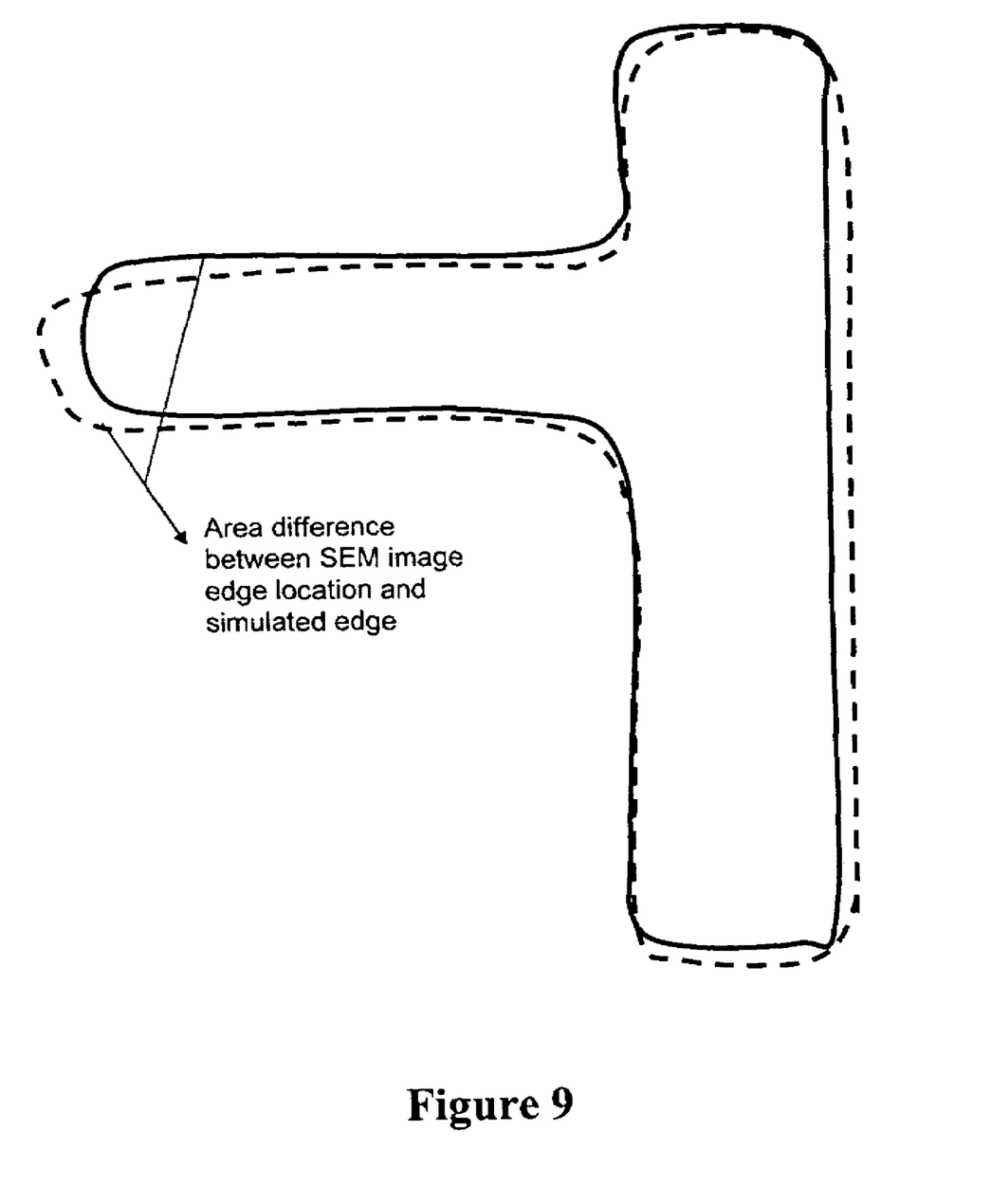
FIG. 9 illustrates the difference between SEM image edge and simulated edge for the pattern.
Figure 10:
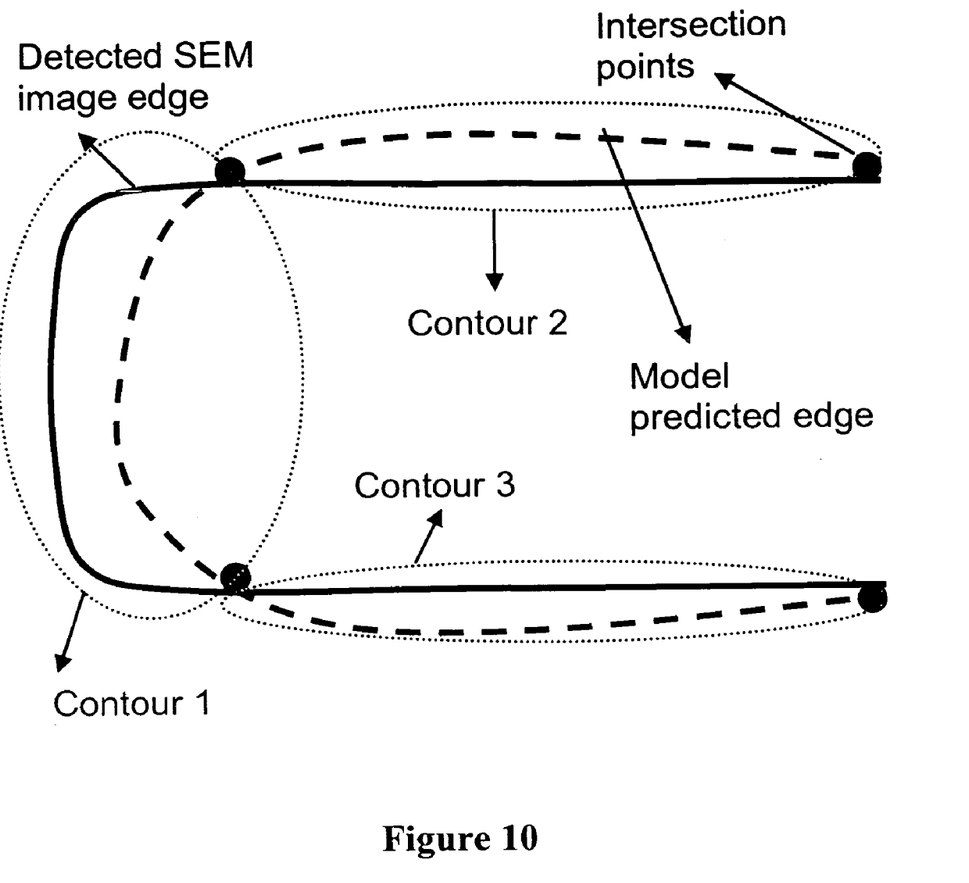
FIG. 10 illustrates the difference between SEM image edge and simulated edge for the pattern. Contours 1, 2, and 3 define the area difference between SEM image edge and model predicted edge.

In the second embodiment, SEM images of the monitoring pattern and multiple sites of the wafer are used for obtaining across wafer and across field variations (defined in FIGS. 9 and 10). In summary, this method comprises:

1. printing monitoring patterns on a product or monitor wafer, such as shown in FIGS. 2 and 3, at multiple sites at cut lines on a wafer as shown in FIG. 1;
2. obtaining SEM images of the printed patterns at multiple sites, or alternatively by atomic-force microscopy (AFM), scanning-tunneling microscopy (STM), or transmission electron microscopy (TEM);
3. processing SEM images with edge-detection algorithm as shown in FIG. 7;
4. aligning both detected edge from the SEM image and model predicted edge locations using alignment patterns as shown in FIG. 8;
5. calculating the area difference between two contours (see FIGS. 9 and 10);
6. this calculated area difference is the goodness factor to monitor the OPC model.

Monitoring structures are printed (either photoresist pattern or etch wafer pattern) at multiple sites at cut lines on the production or monitor wafer. Preferably, these monitoring structures are the critical part of the final product layout.

As will be shown in greater detail, verifying the computational model is implemented by scanning the SEM images taken on the verification patterns.

It should also be understood that images of the printed patterns may be obtained by alternative means, such as by atomic-force microscopy (AFM), scanning-tunneling microscopy (STM), or transmission electron microscopy (TEM). Therefore, there is no intention of limiting the scope of the present invention to using only a scanning electronic microscope to obtain such pattern images.

SEM images (or alternatively AFM, STM, TEM) of monitoring structures printed are taken. These images are usually noisy. A de-noising algorithm is applied to these images to highlight the location of the edges. For example, FIG. 7A illustrates a detected image of a SEM image of the pattern and model predicted edge for the same design feature before applying such a de-noising algorithm, while FIG. 7B illustrates a de-noised image after the algorithm has been applied.

Typically, de-noising can be accomplished using methods like minimum total variance algorithm, Perona-Malik diffusion (non-linear scalar diffusion), Gaussian derivatives, non-local means, and any combination of these methods. For example, consider the following non-linear diffusion scheme as a de-noising method:

$$\partial_t L = \nabla \cdot (c(\|\nabla L\|)\nabla L)$$

where c is a scalar function dependent on the gradient norm $\|\nabla L\|$.

Perona and Malik were the first to introduce non-linear diffusion within the image-processing context and, in this regard, they introduced conductivity functions, that will now be considered relative to the de-noising process:

$$c(\|\nabla L\|) = \exp\left(\frac{\|\nabla L\|^2}{k^2}\right)$$

Furthermore, the quality of these images can be increased by taking multiple images, such as SEM of the same pattern; however, taking the SEM image of photoresist pattern multiple times may heat the photoresist and cause the pattern dimensions to change. But, taking multiple SEM images of the same etched pattern will not have this problem. The step of obtaining the SEM image is repeated a sufficient number of times to improve the quality of the acquired image, but is not repeated such a sufficient number of times to heat the test surface to a sufficient temperature to cause test surface degradation.

In the described de-noising process, it will be understood by those skilled in the art, that multiple images can be averaged to decrease the noise and highlight the edge location. Edge detection can be done thresholding the gradient of the de-noised image. Moreover, it can be also done by thresholding the maximum of the eigenvalues of the Hessian matrix of the de-noised image. Alternatively, it can also be done by thresholding the minimum of the eigenvalues of the Hessian matrix of the de-noised image.

With this short hand notation a 2nd order Taylor expansion of the image L can be expressed as:

$$L(x+y, s) = L + x^T \nabla L + \frac{1}{2} x^T H_L x$$

where $\nabla L$ is the gradient of the image function:

$$\nabla L = \begin{pmatrix} L_x \\ L_y \end{pmatrix}$$

and $H_L$ is the Hessian matrix:

$$H_L = \begin{pmatrix} L_{xx} & L_{xy} \\ L_{xy} & L_{yy} \end{pmatrix}$$

After edge detection of the image is completed (for example, edge detection of an image as best seen in FIG. 7C) and edge contour describing the edge is obtained (for example, edge contour of an image as best seen in FIG. 7D), the model predicted edge for the same verification pattern is calculated using the calibrated models.

Once the edges of the image are detected, the images are aligned using alignment pattern as seen in FIG. 8. In accordance with this alignment pattern, SEM image detected edge and model predicted edge are aligned. If the reader is interested in better understanding of the algorithm, reference may be made to an article by R. C. Gonzales and R. E. Woods, entitled "Digital Image Processing" published by Addison-Wesley Publishing Company, 1992, at pages 571-658, which article is incorporated herein by reference as though fully set forth.

The area difference between 2 edge location contours as shown in FIG. 9 is calculated. For example, in FIG. 10, three model predicted edge contours are illustrated for a model predicted edge: a first contour, a second contour and a third contour. In this regard, FIG. 10 illustrates the difference between a scanned electronic microscope image edge and the simulated edge for the pattern. Contours 1, 2 and 3 define the difference between the SEM image edge and the model predicted edge. Later, for each model predicted, a contour area difference from the printed pattern edge as shown in FIG. 10 is calculated using the following equation:

$$\text{Area} = \frac{1}{2} \sum_{\substack{All \\ Contours}} \oint_{Contour_N} x\,dy - y\,dx$$

The area amount calculated using the equation above is a goodness factor for choosing the calibrated OPC model for the specific verification structure.

Instead of calculating the area difference as a goodness factor, the following alternative embodiments are acceptable: In a first alternative embodiment, the non-overlapping pixels for the areas enclosed with these contours are calculated; and in a second alternative embodiment, the normals between two contours are calculated. Furthermore, edge detection on the images captured by SEM, AFM, STM, TEM, etc., can be directly convolved with the model predicted images instead of using edge detection.

Accordingly, the present invention provides a masking process, comprising:
  providing a production mask having at least one optical proximity corrected (OPC-ed) verification structure and/or monitoring structure; and
  exposing said production mask to form an image of said at least one optical proximity corrected verification structure and/or monitoring structure on a production or monitor wafer surface.

In an embodiment of the present invention, the masking process further comprises:
  producing a optical proximity corrected verification structure and/or monitoring structure.

In another embodiment of the present invention, the masking process further comprises:
  (a) printing and/or etching at least one verification structure and/or monitoring structure on the production or monitor wafer surface; and
  (b) measuring properties of at least one of the verification structure and/or monitoring structure printed and/or etched on the said test surface.

In yet embodiment of the present invention, the properties in (b) comprise a critical dimension of the verification structure and/or monitoring structure printed and/or etched.

In still another embodiment of the present invention, measuring the parameters further comprises:
  (a) processing the obtained critical dimensions to extract an across wafer component of the variations and an across-exposure field component of the variations in the properties measured; and
  (b) processing the critical dimensions obtained in step (a) with edge-detection algorithm.

In one more embodiment of the present invention, the masking process further comprises:
  (a) printing and/or etching at least one verification structure and/or monitoring structure on the test surface; and
  (b) obtaining image of at least one of the verification structure and/or monitoring structure printed and/or etched on the said test surface.

In one another embodiment of the present invention, the image obtained is a SEM image or AFM image or an STM image or a TEM image.

In one further embodiment of the present invention, the masking process further comprises:
(a) processing the obtained images using edge-detection algorithm to obtain detected image edge contours;
(b) aligning the detected image edge contours and model predicted image edge contours using alignment patters; and
(c) calculating the area difference between the detected image edge contours and the model predicted image edge contours.

In a further more embodiment of the present invention, the verification structure and/or monitoring structure comprises a line, and wherein (b) comprises measuring a width of a line of the printed and/or etched verification structure and/or monitoring structure.

In an embodiment of the present invention, the verification structure and/or monitoring structure comprises a space pattern and wherein (b) comprises measuring a width of the space pattern of the printed and/or etched verification structure and/or monitoring structure.

In another embodiment of the present invention, the verification structure and/or monitoring structure comprises a combination of line and space patterns having predetermined width for the line patterns and space pattern.

In yet another embodiment of the present invention, the verification structure and/or monitoring structure comprises a critical or functional part of a product.

In still another embodiment of the present invention, the verification structure and/or monitoring structure are printed and/or etched at plurality of locations on the production or monitor wafer surface.

In one more embodiment of the present invention, the verification structure and/or monitoring structure are printed and/or etched at plurality of locations in cut lines or equivalent scribe lines.

In one another embodiment of the present invention, the masking process further comprises:
printing said at least one optical proximity corrected verification structure and/or at least one monitoring structure.

In a further embodiment of the present invention, the masking process further comprises:
repeating said step of exposing at a plurality of different test sites on said production or monitor wafer surface.

In a further more embodiment of the present invention, the masking process further comprises:
processing said image to locate optical proximity corrected verification structures and/or monitoring structures disposed on said production or monitor wafer surface; and measuring said verification and/or monitoring structures.

In an embodiment of the present invention, the step of processing includes:
applying a de-noising algorithm to said optical proximity corrected verification structures to facilitate edge location of the optical proximity corrected verification structure.

In another embodiment of the present invention, the de-noising algorithm is a combination of one or more different de-noising algorithms selected from the group consisting of: a minimum total variance algorithm; a non-linear scalar diffusion algorithm; a Gaussian derivative algorithm; and a non-local means algorithm.

In yet another embodiment of the present invention, the production or monitor wafer surface is a photoresist surface.

In still another embodiment of the present invention, the production or monitor wafer surface is a semiconductor wafer surface.

In one more embodiment of the present invention, wherein at least one verification structure and/or said at least one monitoring structure are printed and etched on said production or monitor wafer surface.

In one another embodiment of the present invention, the step of obtaining an image is repeated a sufficient number of times to improve the quality of acquired images, but not such a sufficient number of times to heat the test surface to a sufficient temperature to cause test surface degradation.

In a further embodiment of the present invention, the obtained images are averaged to decrease noise and to emphasize edge patterns.

In a further more embodiment of the present invention, the step of processing includes: applying an edge-detection algorithm to detect verification structure edges.

In an embodiment of the present invention, the edge-detection algorithm includes thresholding a gradient of a de-noised verification structure image.

In another embodiment of the present invention, the edge detection algorithm includes thresholding a maximum eigenvalues of a Hessian matrix of a de-noised image of the verification structures printed.

In yet another embodiment of the present invention, the edge detection algorithm includes thresholding a minimum eigenvalues of a Hessian matrix of a de-noised image of the verification structures printed.

In one more embodiment of the present invention, the step of applying includes detecting an edge contour to describe an obtained optical proximity corrected verification structure edge.

In one further embodiment of the present invention, the masking process further comprises:
obtaining a goodness factor to choose a calibrated optical proximity correction model for a specific verification structure.

It will be appreciated that embodiments of the invention described herein may be comprises of one or more conventional processors and unique stored program instructions that control the one or more processors to implement, in conjunction with certain non-processor circuits, some, most, or all of the functions of generating an OPC computational model described herein. As such these functions may be interpreted as steps of a method of generating an OPC computational model. Alternatively, some or all functions could be implemented by a state machine that has no stored program instructions or in one or more application specific integrated circuits (ASICs), in which each function or some combinations of certain of the functions are implemented as custom logic. Of course, a combination of the two approaches could be used. Thus, method and means for these functions have been described herein. Further, it is expected that one of ordinary skill, notwithstanding possibly significant effort and many design choices motivated by, for example, available time, current technology, and economic considerations, when guided by the concepts and principles disclosed herein will be readily capable of generating such software instructions and programs and ICs with minimal experimentation.

We claim:

1. A masking and patterning process, comprising:
providing a production mask having at least one optical proximity corrected (OPC-ed) verification structure and/or monitoring structure;
exposing said production mask to form a first image of said at least one optical proximity corrected verification structure and/or monitoring structure on a photosensitive surface of a production or monitor wafer;

printing and etching at least one verification structure and/or monitoring structure on the photosensitive surface of the production or monitor wafer surface;

obtaining a second image of at least one of the verification structure and/or monitoring structure printed and etched on the test surface;

processing said second image to locate optical proximity corrected verification structures and/or monitoring structures disposed on said production or monitor wafer surface; and measuring properties of at least one of said verification and/or monitoring structures using the processed second image;

and wherein the verification structure and/or monitoring structure are printed and etched at a plurality of locations on the production or monitor wafer surface in cut lines or equivalent scribe lines; and wherein said step of obtaining the second image is repeated a sufficient number of times to improve the quality of acquired second images, but not such a sufficient number of times to heat the test surface to a sufficient temperature to cause test surface degradation.

2. The masking and patterning process according to claim 1, wherein the measured properties comprise critical dimensions of the verification structure and/or monitoring structure printed and etched.

3. The masking and patterning process according to claim 2, further comprising:
(a) processing the measured values of the critical dimensions to extract an across wafer component and an across-exposure field component of variations in the measured values; and
(b) processing the measured values of the critical dimensions with edge-detection algorithm.

4. The masking and patterning process according to claim 1, wherein the second image obtained is a scanning electron microscopy image or an atomic force microscopy image or a scanning tunneling microscopy image or a transmission electron microscopy image.

5. The masking and patterning process according to claim 1, further comprising:
(a) processing the obtained images using edge-detection algorithm to obtain detected image edge contour;
(b) aligning the detected image edge contour and model predicted image edge contours using alignment patterns; and
(c) calculating the area difference between the detected image edge contour and model predicted image edge contours.

6. The masking and patterning process according to claim 1, wherein the verification structure and/or monitoring structure comprises a line, and measuring properties of at least one of the verification structure and/or monitoring structure comprises measuring a width of a line of the printed and etched verification structure and/or monitoring structure.

7. The masking and patterning process according to claim 1, wherein the verification structure and/or monitoring structure comprises a space pattern and measuring properties of at least one of the verification structure and/or monitoring structure comprises measuring a width of the space pattern of the printed and etched verification structure and/or monitoring structure.

8. The masking and patterning process according to claim 1, wherein the verification structure and/or monitoring structure comprises a combination of line and space patterns having predetermined width for the line patterns and space pattern.

9. The masking and patterning process according to claim 1, wherein the verification structure and/or monitoring structure comprises a functional part of a product.

10. The masking and patterning process according to claim 1, further comprising:
repeating said step of exposing at a plurality of different test sites on said production or monitor wafer surface.

11. The masking and patterning process according to claim 1, wherein said step of processing includes:
applying a de-noising algorithm to said optical proximity corrected verification structures to facilitate edge location of the optical proximity corrected verification structure.

12. The masking and patterning process according to claim 11, wherein said de-noising algorithm is a combination of one or more different de-noising algorithms selected from the group consisting of: a minimum total variance algorithm; a non-linear scalar diffusion algorithm; a Gaussian derivative algorithm; and a non-local means algorithm.

13. The masking and patterning process according to claim 1, wherein said photosensitive surface of the production or monitor wafer is a photoresist surface.

14. The masking and patterning process according to claim 1, wherein said photosensitive surface of the production or monitor wafer is a semiconductor wafer surface.

15. The masking and patterning process according to claim 1, wherein the obtained images are averaged to decrease noise and to emphasize edge patterns.

16. The masking and patterning process according to claim 1, wherein said step of processing includes: applying an edge-detection algorithm to detect verification structure edges.

17. The masking and patterning process according to claim 16, wherein said edge-detection algorithm includes thresholding a gradient of a de-noised verification structure image.

18. The masking and patterning process according to claim 16, wherein said edge detection algorithm includes thresholding a maximum eigenvalues of a Hessian matrix of a de-noised image of the verification structures printed.

19. The masking and patterning process according to claim 16, wherein said edge detection algorithm includes thresholding a minimum eigenvalues of a Hessian matrix of a de-noised image of the verification structures printed.

20. The masking and patterning process according to claim 16, wherein said step of applying includes detecting an edge contour to describe an obtained optical proximity corrected verification structure edge.

* * * * *